(12) United States Patent
Lasser

(10) Patent No.: US 8,024,509 B2
(45) Date of Patent: Sep. 20, 2011

(54) METHOD OF MANAGING A MULTI-BIT-CELL FLASH MEMORY

(75) Inventor: Menahem Lasser, Kohav Yair (IL)

(73) Assignee: Sandisk IL Ltd., Kfar Saba (IL)

( * ) Notice: Subject to any disclaimer, the term of this patent is extended or adjusted under 35 U.S.C. 154(b) by 0 days.

(21) Appl. No.: 11/923,688

(22) Filed: Oct. 25, 2007

(65) Prior Publication Data

US 2008/0123412 A1 May 29, 2008

Related U.S. Application Data

(63) Continuation of application No. 11/198,180, filed on Aug. 8, 2005, now Pat. No. 7,716,413, and a continuation-in-part of application No. 10/829,979, filed on Apr. 23, 2004.

(60) Provisional application No. 60/624,675, filed on Nov. 4, 2004.

(51) Int. Cl.
*G06F 12/00* (2006.01)
*G06F 12/02* (2006.01)

(52) U.S. Cl. ........................ 711/103; 711/156

(58) Field of Classification Search .................. 711/103, 711/156
See application file for complete search history.

(56) References Cited

U.S. PATENT DOCUMENTS

| 5,404,485 | A | | 4/1995 | Ban |
| 5,434,825 | A | | 7/1995 | Harari |
| 5,544,312 | A | * | 8/1996 | Hasbun et al. .................. 714/42 |
| 5,671,388 | A | * | 9/1997 | Hasbun .......................... 711/103 |
| 5,859,795 | A | * | 1/1999 | Rolandi .......................... 365/168 |
| 5,930,167 | A | | 7/1999 | Lee et al. |
| 5,936,884 | A | * | 8/1999 | Hasbun et al. ............ 365/185.03 |
| 5,937,425 | A | | 8/1999 | Ban |
| 6,104,641 | A | | 8/2000 | Itou |
| 6,148,354 | A | | 11/2000 | Ban et al. |
| 6,297,988 | B1 | * | 10/2001 | Parker et al. .............. 365/185.03 |
| 6,426,893 | B1 | * | 7/2002 | Conley et al. ............. 365/185.11 |

(Continued)

FOREIGN PATENT DOCUMENTS

KR  10-2000-0031100  5/2000

OTHER PUBLICATIONS

Tanenbaum, A.S. Structured Copmuter Organization. 1984. Prentice-Hall Inc.pp. 10-12.*

(Continued)

*Primary Examiner* — Sanjiv Shah
*Assistant Examiner* — Samuel Dillon
(74) *Attorney, Agent, or Firm* — Toler Law Group

(57) ABSTRACT

A flash memory is managed by reserving one or more cells as flag cells to represent the number N of bits to store in the cells of a memory block, selecting the value of N from at least three candidates, and programming the flag cell(s) to represent the selected value. A flash memory is managed by selecting a value of the number N>2 of bits to store in the cells of a portion (e.g. a block or page) of the memory, reserving one other cell of the memory as a flag cell to represent how many bits actually are stored in each cell of the portion, and, as the cells of the portion are successively programmed with $1 \leq n \leq N$ bits, programming the flag cell to represent n.

60 Claims, 6 Drawing Sheets

U.S. PATENT DOCUMENTS

| | | | |
|---|---|---|---|
| 6,522,580 B2 | 2/2003 | Chen et al. | |
| 6,535,419 B2 | 3/2003 | Parker et al. | |
| 6,549,457 B1 * | 4/2003 | Srinivasan et al. | 365/185.03 |
| 6,687,325 B1 * | 2/2004 | Wells | 377/26 |
| 6,834,331 B1 * | 12/2004 | Liu | 711/156 |
| 6,839,823 B1 * | 1/2005 | See et al. | 711/171 |
| 6,903,972 B2 | 6/2005 | Lasser et al. | |
| 6,988,175 B2 | 1/2006 | Lasser | |
| 7,181,672 B2 * | 2/2007 | Atri et al. | 714/763 |
| 7,310,347 B2 | 12/2007 | Lasser | |
| 7,525,840 B2 * | 4/2009 | Rahman et al. | 365/185.03 |
| 2005/0024941 A1 | 2/2005 | Lasser et al. | |

OTHER PUBLICATIONS

Eiten et al. Multilevel Flash Cells and their Trade-offs. IEEE. 1996.*

U.S. Appl. No. 11/035,807, filed Sep. 2005, Menahem Lasser.

M. Bauer et al. "A Multilevel-Cell 32Mb Flash Memory," 1995 IEEE International Solid-State Circuits Conference, pp. 132-134.

Notification of Transmittal of the International Search Report or the Declaration and International Search Report and Written Opinion received in International Application No. PCT/IL05/00032 from the International Searching Authority mailed Dec. 4, 2006, 10 pages.

Korean Office Action and Translation mailed Feb. 26, 2010 in Korean Patent Application No. 10-2009-7026223, 7 pages.

International Preliminary Report on Patentability received in International Application No. PCT/IL2005/001149 mailed Mar. 24, 2009, including the International Search Report and Written Opinion from the International Searching Authority mailed Jul. 18, 2008, 9 pages.

Korean Office Action Translation for Korean Patent Application No. 10-2006-7017506 mailed Apr. 29, 2009, 6 pages.

Korean Office Action Translation for Korean Patent Application No. 10-2006-7017506 mailed Oct. 30, 2009, 4 pages.

Korean Office Action Translation for Korean Patent Application No. 10-2007-7010170 mailed Apr. 27, 2009, 11 pages.

Non-Final Office Action for U.S. Appl. No. 10/829,979 mailed Sep. 19, 2006, 18 pages.

Final Office Action for U.S. Appl. No. 10/829,979 mailed Feb. 8, 2007, 15 pages.

Advisory Action Before the Filing of an Appeal Brief for U.S. Appl. No. 10/829,979 mailed Apr. 16, 2007, 3 pages.

Non-Final Office Action for U.S. Appl. No. 10/829,979 mailed Jun. 18, 2007, 16 pages.

Non-Final Office Action for U.S. Appl. No. 10/829,979 mailed Jan. 2, 2008, 17 pages.

Non-Final Office Action for U.S. Appl. No. 10/829,979 mailed Mar. 18, 2010, 18 pages.

Final Office Action for U.S. Appl. No. 10/829,979 mailed Jul. 30, 2010, 18 pages.

Non-Final Office Action for U.S. Appl. No. 11/198,180 mailed Oct. 18, 2006, 21 pages.

Final Office Action for U.S. Appl. No. 11/198,180 mailed Apr. 6, 2007, 17 pages.

Advisory Action Before the Filing of an Appeal Brief for U.S. Appl. No. 11/198,180 mailed Jun. 13, 2007, 3 pages.

Non-Final Office Action for U.S. Appl. No. 11/198,180 mailed Apr. 17, 2008, 16 pages.

Final Office Action for U.S. Appl. No. 11/198,180 mailed Jan. 26, 2009, 20 pages.

Notice of Allowance and Fee(s) Due for U.S. Appl. No. 11/198,180 mailed Jul. 9, 2009, 7 pages.

Notice of Allowance and Fee(s) Due for U.S. Appl. No. 11/198,180 mailed Jan. 11, 2010, 4 pages.

Non-Final Office Action for U.S. Appl. No. 10/829,979 mailed Jan. 19, 2011, 14 pages.

* cited by examiner

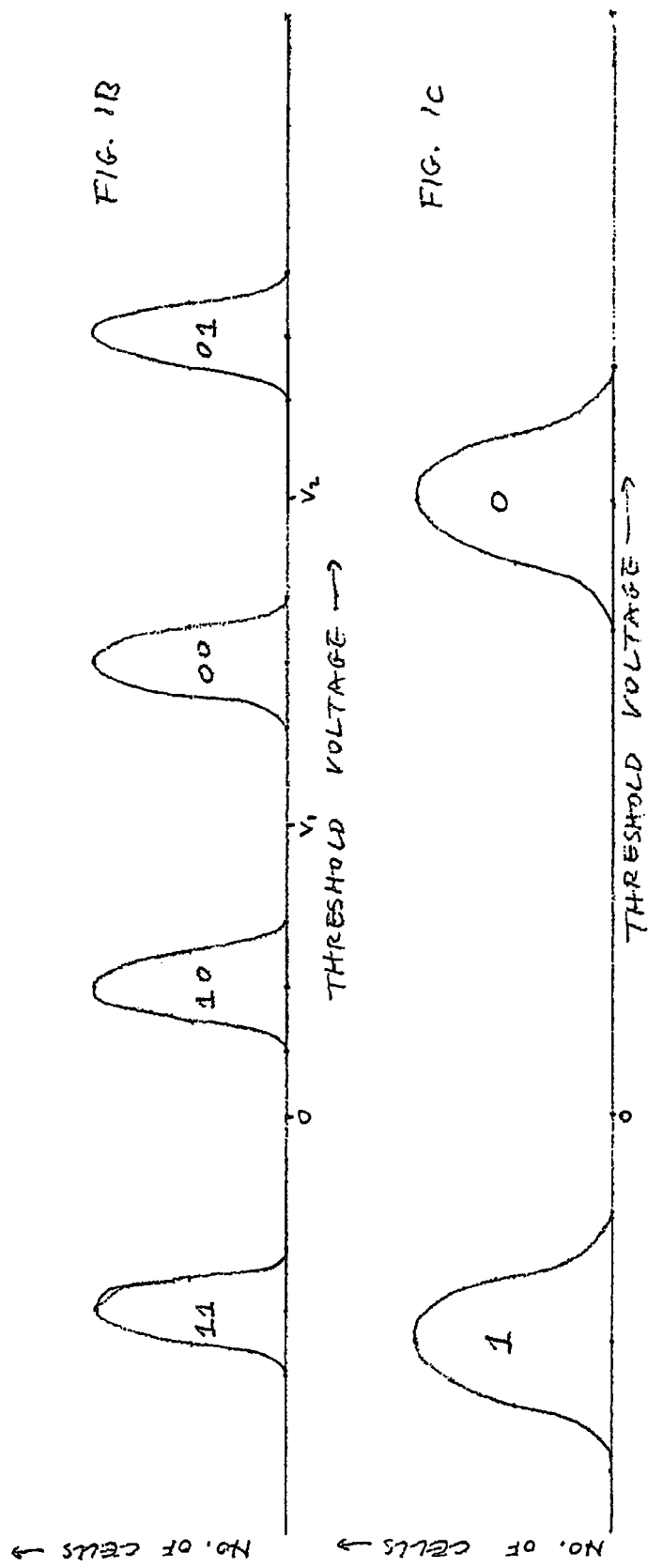

METHOD OF MANAGING A MULTI-BIT-CELL FLASH MEMORY

This is a Continuation of U.S. patent application Ser. No. 11/198,180 filed Aug. 8, 2005 now U.S. Pat. No. 7,716,413, which claims the benefit of U.S. Provisional Patent Application No. 60/624,675, filed Nov. 4, 2004, and is a continuation-in-part of U.S. patent application Ser. No. 10/829,979, filed Apr. 23, 2004

FIELD AND BACKGROUND OF THE INVENTION

The present invention relates to flash memories and, more particularly, to a method of managing a flash memory, whose cells can be programmed with either one bit each or more than one bit each, so that the number of bits per cell can be determined upon power-up or during recovery from power loss.

Flash memory devices have been known for many years. Typically, each cell within a flash memory stores one bit of information. Traditionally, the way to store a bit has been by supporting two states of the cell—one state represents a logical "0" and the other state represents a logical "1". In a flash memory cell the two states are implemented by having a floating gate above the cell's channel (the area connecting the source and drain elements of the cell's transistor), and having two valid states for the amount of charge stored within this floating gate. Typically, one state is with zero charge in the floating gate and is the initial unwritten state of the cell after being erased (commonly defined to represent the "1" state) and another state is with some amount of negative charge in the floating gate (commonly defined to represent the "0" state). Having negative charge in the gate causes the threshold voltage of the cell's transistor (i.e. the voltage that has to be applied to the transistor's control gate in order to cause the transistor to conduct) to increase. Now it is possible to read the stored bit by checking the threshold voltage of the cell—if the threshold voltage is in the higher state then the bit value is "0" and if the threshold voltage is in the lower state then the bit value is "1". Actually there is no need to accurately read the cell's threshold voltage—all that is needed is to correctly identify in which of the two states the cell is currently located. For that purpose it is enough to make a comparison against a reference voltage value that is in the middle between the two states, and thus to determine if the cell's threshold voltage is below or above this reference value.

FIG. 1A shows graphically how this works. Specifically, FIG. 1A shows the distribution of the threshold voltages of a large population of cells. Because the cells in a flash device are not exactly identical in their characteristics and behavior (due, for example, to small variations in impurities concentrations or to defects in the silicon structure), applying the same programming operation to all the cells does not cause all of the cells to have exactly the same threshold voltage. (Note that, for historical reasons, writing data to a flash memory is commonly referred to as "programming" the flash memory.) Instead, the threshold voltage is distributed similar to the way shown in FIG. 1A. Cells storing a value of "1" typically have a negative threshold voltage, such that most of the cells have a threshold voltage close to the value shown by the left peak of FIG. 1A, with some smaller numbers of cells having lower or higher threshold voltages. Similarly, cells storing a value of "0" typically have a positive threshold voltage, such that most of the cells have a threshold voltage close to the value shown by the right peak of FIG. 1A, with some smaller numbers of cells having lower or higher threshold voltages.

In recent years a new kind of flash device has appeared on the market, using a technique conventionally called "Multi Level Cells" or MLC for short. (This nomenclature is misleading, because the previous type of flash cells also have more than one level: they have two levels, as described above. Therefore, the two kinds of flash cells are referred to herein as "Single Bit Cells" (SBC) and "Multi-Bit Cells" (MBC).) The improvement brought by the MBC flash is the storing of two bits in each cell. (In principle MBC also includes the storage of more than two bits per cell, but such cells are not in the market yet at the present time. In order to simplify the explanations, the two-bit case is emphasized herein. It should however be understood the present invention is equally applicable to flash memory devices that support more than two bits per cell.) In order for a single cell to store two bits of information the cell must be able to be in one of four different states. As the cell's "state" is represented by its threshold voltage, it is clear an MBC cell should support four different valid ranges for its threshold voltage. FIG. 1B shows the threshold voltage distribution for a typical MBC cell. As expected, FIG. 1B has four peaks, each corresponding to one state. As for the SBC case, each state is actually a range and not a single number. When reading the cell's contents, all that must be guaranteed is that the range that the cell's threshold voltage is in is correctly identified. For a prior art example of an MBC flash device see U.S. Pat. No. 5,434,825 to Harari.

When encoding two bits in an MDC cell by the four states, it is common to have the left-most state in FIG. 1B (typically having a negative threshold voltage) represent the case of both bits having a value of "1". (In the discussion below the following notation is used—the two bits of a cell are called the "lower bit" and the "upper bit". An explicit value of the bits is written in the form ["upper bit" "lower bit"], with the lower bit value on the right. So the case of the lower bit being "0" and the upper bit being "1" is written as "10". One must understand that the selection of this terminology and notation is arbitrary, and other names and encodings are possible). Using this notation, the left-most state represents the case of "11". The other three states are typically assigned by the following order from left to right—"10", "00", "01". One can see an example of an implementation of an MBC NAND flash device using such encoding as described above in U.S. Pat. No. 6,522,580 to Chen, which patent is incorporated by reference for all purposes as if fully set forth herein. See in particular FIG. 8 of the Chen patent. It should be noted though that the present invention does not depend on this assignment of the states, and any other ordering can be used, provided that the ordering satisfies the condition stated below. When reading an MBC cell's content, the range that the cell's threshold voltage is in must be identified correctly; only in this case this cannot always be achieved by comparing to one reference voltage, and several comparisons may be necessary. For example, in the case illustrated in FIG. 1B, one way to read the lower bit is first to compare the cell's threshold voltage to a reference comparison voltage $V_1$ and then, depending on the outcome of the comparison, to compare the cell's threshold voltage to either a zero reference comparison voltage or a reference comparison voltage $V_2$. Another way to read the lower bit is to compare the cell's threshold voltage unconditionally to both the zero reference voltage and $V_2$. In either case, two comparisons are needed.

MBC devices provide a great advantage of cost—using a similarly sized cell one stores two bits rather than one. However, there are also some drawbacks to using MBC flash—the average read and write times of MDC memories are longer than of SLC memories, resulting in lower performance. Also, the reliability of MDC is lower than SBC. This can easily be understood—the differences between the threshold voltage ranges in MBC are much smaller than in SBC. Thus, a disturbance in the threshold voltage (e.g. leaking of the stored charge causing a threshold voltage drift, interference from operations on neighboring cells, etc.) that may have gone unnoticed in SBC because of the large gap between the two states, might cause an MBC cell to move from one state to another, resulting in an erroneous bit. The end result is a lower quality specification of MBC cells in terms of data retention time or the endurance of the device to many write/erase cycles. Thus there are advantages to using both MBC cells and SBC cells, and the selection can be different depending on the application's requirements.

It is obvious that a cell designed for MBC operation should also be able to operate as an SBC cell. After all, two states are just a subset of 4 states. Indeed, this idea already has appeared in the prior art—see for example U.S. Pat. No. 6,426,893 to Conley et al., where it is proposed to use both MBC and SBC modes within the same device, selecting certain parts of the device to operate with highest density in MBC mode, while other parts are used in SBC mode and provide better performance.

Other prior art goes even further—deciding on the mode a specific flash block operates in (whether MBC or SBC) dynamically during the application's run-time. For example, U.S. Pat. No. 5,930,167 to Lee et al. describes a system in which incoming data that has to be stored is first programmed in SBC mode so as to provide fast response time, and later is reprogrammed using MBC mode. The SBC mode thus provides a kind of caching mechanism. The second writing (done in MBC mode) can be done in the same place where the data was originally programmed in SBC mode, so it is clear the same area is dynamically switched between modes. Such programming in SBC mode vs. MBC mode is referred to herein as "N-bit programming", with N=1 referring to SBC mode and N>1 referring to MBC mode.

However, such dynamic mode switching of flash blocks during run-time creates a problem. Think about what happens when power is unexpectedly removed from the device. When the power is later restored and the system's software starts running again, the system has to find out what mode was previously used for writing the data. Without knowing this, a wrong reading might result. FIGS. 1A and 1B illustrate why—suppose a cell was really programmed using 1-bit mode to contain a "0", and the distribution is according to FIG. 1A. If the system mistakenly assumes the cell was programmed using 2-bit mode, the system will instruct the device to attempt a reading using 2-bit mode, which will cause the device circuitry to try to identify which of the four states exists. However, trying to distinguish between the two center states ("10" and "00" in our example) the flash circuitry might place the reference comparison voltage at a voltage value that is within the distribution range of the rightmost state of the SBC cell. FIG. 1B shows such a case: reference comparison voltage $V_1$ is exactly in the middle of the upper threshold voltage distribution of FIG. 1A. This means the result of this comparison and consequently the result of this reading cannot be predicted—in some cells the reading will return "10" and in others it will return "00", even though all such cells were programmed to "0" in 1-bit mode. Such reading under the wrong mode produces unpredictable results. If such mistakes are allowed to take place, the contents of the storage device will become useless.

Similarly, if the distribution of threshold voltages in a 1-bit mode cell is as shown in FIG. 1C, if the system mistakenly assumes that the cell was programmed using 2-bit mode, when trying to distinguish between the two rightmost states ("00" and "01" in our example) the flash circuitry places reference comparison voltage $V_2$ at a voltage value within the distribution of the right-most state of the SBC cell. Sometimes the presumed lower bit of the cell is read as "0", and sometimes the presumed lower bit of the cell is read as "1".

Obviously, one can defend against such mistakes by keeping in the storage device detailed tables in which it is specified which mode is used for writing each memory block. The table itself must be kept in a fixed predetermined mode and in a pre-known location, so that there are no mistakes in reading the table. But such a solution has very undesirable consequences. First, each "useful" write operation must now be accompanied by an "auxiliary" write for updating the table, resulting in lower write performance. Second, the complexity of the flash management software is significantly increased—protection must be provided against loss of the table due to a block becoming bad; protection must be provided against a power loss occurring in the middle of updating the table, etc.

There is thus a widely recognized need for, and it would be highly advantageous to have, an efficient way to tell which mode, SBC or MBC, was used to program a flash memory block that could have been programmed using either mode.

SUMMARY OF THE INVENTION

According to the present invention there is provided a method of managing a flash memory, including the steps of: (a) reserving at least one cell of the flash memory to use as a flag cell to represent a value of a number N of bits of data to store in each of a plurality of other cells of a block of the flash memory; (b) selecting a value of N from among at least three candidate values of N; and (c) programming the at least one flag cell to represent the selected value of N.

According to the present invention there is provided a memory device including: (a) a flash memory including at least one block, each at least one block including a plurality of cells; and (b) a flash memory controller operative, for one of the at least one block: (i) to reserve at least one cell of the one block to use as a flag cell to represent a value, of a number N of bits of data to store in a plurality of other cells of the one block, (ii) to select a value of N from among at least three candidate values of N, and (iii) to program the at least one flag cell to represent the selected value of N.

According to the present invention there is provided a system including: (a) a flash memory including at least one block, each at least one block including a plurality of cells; (b) a non-volatile memory for storing program code for, for one of the at least one block: (i) reserving at least one cell of the one block to use as a flag cell to represent a value, of a number N of bits of data to store in a plurality of other cells of the one block, (ii) selecting a value of N from among at least three candidate values of N, and (iii) programming the at least one flag cell to represent the selected value of N; and (c) a processor for executing the program code.

According to the present invention there is provided a computer-readable storage medium having computer-readable code embedded on the computer-readable storage medium, the computer-readable code for managing a flash memory that includes at least one block, each at least one block including a plurality of cells, the computer-readable code including program code for, for one of the at least one block: (a) reserving at least one cell of the one block to use as a flag cell to represent a value, of a number N of bits of data to store in a plurality of other cells of the one block; (b) selecting a value of N from among at least three candidate values of N; and (c) programming the at least one flag cell to represent the selected value of N.

According to the present invention there is provided a method of managing a non-volatile array of storage elements individually having a storage window divisible into a plurality of defined ranges of storage levels representative of $N \geq 1$ bits and which are separated from one another, the method including the steps of: (a) reserving at least one storage element to use as a flag storage element to represent a value of N for each of a plurality of other storage elements of at least a portion of the non-volatile array; (b) selecting a value of N from among at least three candidate values of N; and (c) setting the at least one flag storage element to represent the selected value of N.

According to the present invention there is provided a memory device including: (a) a non-volatile array of storage elements individually having a storage window divisible into a plurality of defined ranges of storage levels representative of $N \geq 1$ bits and which are separated from one another; and (b) a controller for: (i) reserving at least one storage element to use as a flag storage element to represent a value of N for each of a plurality of other storage elements of at least a portion of the non-volatile array, (ii) selecting a value of N from among at least three candidate values of N, and (iii) setting the at least one flag storage element to represent the selected value of N.

According to the present invention there is provided a system including: (a) a non-volatile array of storage elements individually having a storage window divisible into a plurality of defined ranges of storage levels representative of $N \geq 1$ bits and which are separated from one another; (b) a non-volatile memory for storing program code for: (i) reserving at least one storage element to use as a flag storage element to represent a value of N for each of a plurality of other storage elements of at least a portion of the non-volatile array; (ii) selecting a value of N from among at least three candidate values of N, and (iii) setting the at least one flag storage element to represent the selected value of N; and (c) a processor for executing the program code.

According to the present invention there is provided a computer-readable storage medium having computer-readable code embedded on the computer-readable storage medium, the computer-readable code for managing a non-volatile array of storage elements individually having a storage window divisible into a plurality of defined ranges of storage levels representative of $N \geq 1$ bits and which are separated from one another, the computer-readable code including: (a) program code for reserving at least one storage element to use as a flag storage element to represent a value of N for each of a plurality of other storage elements of at least a portion of the non-volatile array; (b) program code for selecting a value of N from among at least three candidate values of N, and (c) program code for setting the at least one flag storage element to represent the selected value of N.

According to the present invention there is provided a method of managing a flash memory, including the steps of: (a) selecting a value of a number $N \geq 3$ of respective bits of data to be stored in each of a plurality of cells of at least a portion of a flash memory; (b) reserving a single other cell of the flash memory to use as a flag cell to represent a value of how many of the N bits are stored in each cell of the plurality; and (c) successively, for each value of n between 1 and N: (i) programming each cell of the plurality to represent a first respective n bits of the data, and (ii) programming the flag cell to represent n.

According to the present invention there is provided a memory device including: (a) a flash memory including at least one block, each at least one block including at least one page, each at least one page including a plurality of cells; and (b) a flash memory controller operative, for a portion of the flash memory selected from the group consisting of one of the at least one block and one of the at least one page of one of the at least one block: (i) to select a value of a number $N \geq 3$ of respective bits of data to be stored in each of a plurality of cells of the portion, (ii) to reserve a single other cell of the portion to use as a flag cell to represent a value of how many of the N bits are stored in each cell of the plurality, and (iii) successively, for each value of n between 1 and N: (A) to program each cell of the plurality to represent a first respective n bits of the data, and (B) to program the flag cell to represent n.

According to the present invention there is provided a system including (a) a flash memory including at least one block, each at least one block including at least one page, each at least one page including a plurality of cells; (b) a non-volatile memory for storing program code for, for a portion of the flash memory selected from the group consisting of one of the at least one block and one of the at least one page of one of the at least one block: (i) selecting a value of a number $N \geq 3$ of respective bits of data to be stored in each of a plurality of cells of the portion, (ii) reserving a single other cell of the portion to use as a flag cell to represent a value of how many of the N bits are stored in each cell of the plurality, and (iii) successively, for each value of n between 1 and N: (A) programming each cell of the plurality to represent a first respective n bits of the data, and (B) programming the flag cell to represent n; and (c) a processor for executing the program code.

According to the present invention there is provided a computer-readable storage medium having computer-readable code embedded on the computer-readable storage medium, the computer-readable code for managing a flash memory that includes at least one block, each at least one block including at least one page, each at least one page including a plurality of cells, the computer-readable code including program code for, for a portion of the flash memory selected from the group consisting of one of the at least one block and one of the at least one page of one of the at least one block: (a) selecting a value of a number $N \geq 3$ of respective bits of data to be stored in each of a plurality of cells of the portion; (b) reserving a single other cell of the portion to use as a flag cell to represent a value of how many of the N bits are stored in each cell of the plurality; and (c) successively, for each value of n between 1 and N: (i) programming each cell of the plurality to represent a first respective n bits of the data, and (ii) programming the flag cell to represent n.

According to the present invention there is provided a method of managing a non-volatile array of storage elements individually having a storage window divisible into a plurality of defined ranges of storage levels representative of at least one bit of data and which are separated from one another, the method including the steps of: (a) selecting a number $N \geq 3$ of bits to be represented by the defined ranges of the storage levels of each of a plurality of the storage elements of at least a portion of the non-volatile array; (b) reserving a single other storage element to use as a flag storage element to represent a value of how many of the N bits are stored in each storage element of the plurality; and (c) successively, for each value of n between 1 and N: (i) setting each storage element of the plurality to represent a first respective n bits of the data, and (ii) setting the flag storage element to represent n.

According to the present invention there is provided a memory device including: (a) a non-volatile array of storage elements individually having a storage window divisible into a plurality of defined ranges of storage levels representative of at least one bit of data and which are separated from one another; and (b) a controller for: (i) selecting a number $N \geq 3$ of bits to be represented by the defined ranges of the storage levels of each of a plurality of the storage elements of at least a portion of the non-volatile array, (ii) reserving a single other storage element to use as a flag storage element to represent a value of how many of the N bits are stored in each storage element of the plurality, and (iii) successively, for each value of n between 1 and N: (A) setting each storage element of the plurality to represent a first respective n bits of the data, and (B) setting the flag storage element to represent n.

According to the present invention there is provided a system including: (a) a non-volatile array of storage elements individually having a storage window divisible into a plurality of defined ranges of storage levels representative of at least one bit of data and which are separated from one another; (b) a non-volatile memory for storing program code for: (i) selecting a number $N \geq 3$ of bits to be represented by the defined ranges of the storage levels of each of a plurality of the storage elements of at least a portion of the non-volatile array, (ii) reserving a single other storage element to use as a flag storage element to represent a value of how many of the N bits are stored in each storage element of the plurality, and (iii) successively, for each value of n between 1 and N: (A) setting each storage element of the plurality to represent a first respective n bits of the data, and (B) setting the at least one flag storage element to represent n; and (c) a processor for executing the program code.

According to the present invention there is provided a computer-readable storage medium having computer-readable code embedded on the computer-readable storage medium, the computer-readable code for managing a non-volatile array of storage elements individually having a storage window divisible into a plurality of defined ranges of storage levels representative of at least one bit of data and which are separated from one another, the computer-readable code including: (a) program code for selecting a number $N \geq 3$ of bits to be represented by the defined ranges of the storage levels of each of a plurality of the storage elements of at least a portion of the non-volatile array; (b) program code for reserving a single other storage element to use as a flag storage element to represent a value of how many of the N bits are stored in each storage element of the plurality; and (c) program code for successively, for each value of n between 1 and N: (i) setting each storage element of the plurality to represent a first respective n bits of the data, and (ii) setting the flag storage element to represent n.

The smallest group of flash cells for which an N-bit programming mode can be jointly selected is referred to herein as a "block" of flash cells. The smallest group of cells within a block of a NAND flash memory which can be programmed together is referred to herein as a "page". The N=2 NAND flash memories presently available commercially are those described in the Chen et al. patent cited above. In these memories, the upper bits and the lower bits of the cells belong to different pages. It also is possible to have each cell of a N=2 NAND flash memory belong to a particular page. The present invention works for both kinds of N=2 NAND flash memories.

According to a first aspect of the present invention, a flash memory is managed by reserving one or more cells of the flash memory to use as (a) flag cell(s) to represent how many ("N") bits of data to store in the cells of a block of the flash memory. A value of N is selected from among at least three candidate values. The flag cell(s) is/are programmed to represent the selected value of N. Preferably, the cells of the block then are programmed to represent the data in accordance with the selected value of N. In preferred embodiments of this method, only one cell is reserved to be used as a flag cell for the block, or N is selected from among only three candidate values, or N is selected from among four candidate values.

According to a second aspect of the present invention, a flash memory is managed by selecting a value of a number N>2 of respective data bits to store in each of the cells of a portion (typically a block or a page) of a flash memory (or possibly of the whole memory), and one other cell of the flash memory is reserved to be used as a flag cell to represent a value of how many of the N bits actually are stored in each of the cells that hold the data bits. As the cells that hold the data bits are programmed successively to represent 1, 2, ..., N bits per cell, the flag cell is programmed to represent the number n of bits currently actually represented by the cells that hold the data bits. In preferred embodiments of this method, N is selected to be exactly 3 or 4.

A memory device of the present invention includes a flash memory that includes at least one block of cells (for both aspects) or at least one page of cells (for the second aspect), and a flash memory controller that manages the flash memory according to the method of the relevant aspect of the present invention. A system of the present invention includes a flash memory that includes at least one block of cells (for both aspects) or at least one page (for the second aspect), a non-volatile memory (usually but not necessarily separate from the flash memory) for storing program code for implementing the method of the relevant aspect of the present invention, and a processor for executing the code. The scope of the present invention also includes a computer-readable storage medium in which is embedded computer-readable code for implementing the method of one of the two aspects of the present invention.

More generally, the scope of the present invention extends beyond flash memories to include any of the memories discussed in the Chen patent cited above: memories that include non-volatile arrays of storage elements such that each storage element has a storage window divisible into a plurality of defined ranges of storage levels that represent one or more bits of data. The cells of a MBC flash memory are examples of such storage elements. The blocks of a MBC flash memory are examples of such non-volatile arrays.

In the context of the present invention, "programming" or "setting" a flag cell or a non-volatile storage element to represent one member of a set of integers means placing the flag cell or the nonvolatile storage element in a state that corresponds only to that integer and to no other integer of the set. For example, one way to program a flag cell to represent a selected one of the integers 1, 2 and 3 is to program the cell with N=3 to be in the second threshold voltage range from the left in FIG. 4 below (between a threshold voltage of zero and a threshold voltage of $V_1$) to represent the integer 1, to be in the fourth threshold voltage range from the left in FIG. 4 below (between a threshold voltage of $V_2$ and a threshold voltage of $V_3$) to represent the integer 2, and to be in the rightmost threshold voltage range in FIG. 4 below to represent the integer 3. Preferably, if two or more flag cells are used to represent the same integer for a set of other cells, all of the flag cells are programmed identically.

BRIEF DESCRIPTION OF THE DRAWINGS

The invention is herein described, by way of example only, with reference to the accompanying drawings, wherein:

FIGS. 1A and 1C illustrate the threshold voltage distributions of flash cells programmed in 1-bit mode;

FIG. 1B illustrates the threshold voltage distributions of flash cells programmed in 2-bit mode;

DESCRIPTION OF THE PREFERRED EMBODIMENTS

The present invention is of a method of managing the programming of the cells of a flash memory with different numbers of bits. Specifically, the present invention can be used, during normal power-up or upon recovery from a power loss, to determine the bit number mode that was used to program the flash cells of each block of the memory or the number of bits that actually have been programmed in the flash cells of each page of the memory.

The principles and operation of a flash memory according to the present invention may be better understood with reference to the drawings and the accompanying description.

Figure 1A:
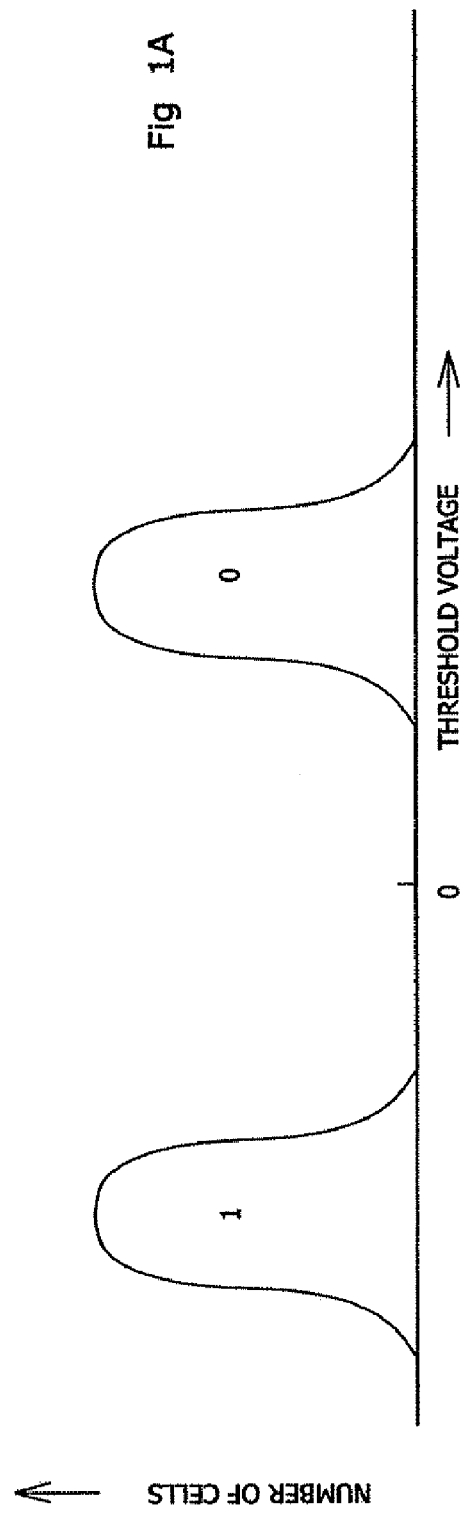

The preferred embodiment of the present invention assumes that the reference voltage used to distinguish the unprogrammed state of a cell from any of its programmed states is the same for all values of N. This condition is in fact satisfied by most flash memories that support N>1, because commonly the states of a N=1 flash cell are defined so that the "1" state has a negative threshold voltage and the "0", state has a positive threshold voltage; and the states of a N>1 flash cell are defined so that the unprogrammed state (e.g. the "11" state of a N=2 flash cell) has a negative threshold voltage and the other states have positive threshold voltages. A reference voltage of zero then serves to distinguish the unprogrammed state of any flash cell from the programmed state(s) of any flash cell, independent of the value of N used to program the cell. This is precisely the situation illustrated in FIGS. 1A and 1B. Note that it is not necessary for the reference voltage that distinguishes the unprogrammed state from the programmed state(s) to be zero volts, as long as the same reference voltage works for all values of N.

Within each block of a flash memory that supports N>1, a set of one or more cells is reserved for use as flag cells to indicate the value of N to be used for reading and programming the cells of the block. Note that N is allowed to change over the lifetime of the block. For example, if the flash memory is managed as taught in the Lee et al. patent cited above, a block that initially is used with N=1 to cache data may subsequently be used with N=2 for long-term storage of data.

Each page of a NAND flash memory includes both a main portion that typically is used to store user data and an additional, smaller portion that typically is reserved for management functions. Most conveniently, the flag cells are selected from among the cells assigned to the management portions of the blocks.

No matter what value of N is assigned to a block, the flag cell(s) is/are programmed as though N=1, in the sense that only one bit per cell is changed from its unprogrammed value. For example, under the convention used above in which the bit value stored in an unprogrammed N=2 cell is interpreted as two "1" bits, a flag cell is either left unprogrammed or programmed as either "10" or "01"; but never as "00".

The simplest way of encoding N in flag cells of a block whose cells support N equal to either 1 or 2 uses only one flag cell.

In one preferred embodiment of the present invention, if N=2, the flag cell is left unprogrammed. If N=1, the flag cell is programmed as "0". Using the threshold voltage distributions of FIGS. 1A and 1B, if the threshold voltage of the flag cell is found to be negative, then N is guaranteed to be equal to 2, and if the threshold voltage of the flag cell is found to be positive, then N is guaranteed to be equal to 1. For redundancy, it is preferable to use several flag cells per block; but all the flag cells of the block are set similarly: all the flag cells are left unprogrammed to indicate that N=2 and are programmed as "0" to indicate that N=1. Care must be taken never to program the second bit of the flag cellos) of a N=2 block; because such programming would change the threshold voltage(s) of the flag cell(s) from negative to positive, thereby changing the meaning of the flag(s) from "N=2" to "N=1".

In another preferred embodiment of the present invention, if N=1, the flag cell is left unprogrammed; and if N=2, the flag cell is programmed as either "10" or "01". Using the threshold voltage distributions of FIGS. 1A and 1B, if the threshold voltage of the flag cell is found to be negative, then N is guaranteed to be equal to 1, and if the threshold voltage of the flag cell is found to be positive, then N is guaranteed to be equal to 2. Again, for redundancy, it is preferable to use several flag cells per block; but all the flag cells of the block are set similarly. all the flag cells are left unprogrammed to indicate that N=1 and are programmed as either "10" or "01" to indicate that N=2. Under this preferred embodiment, it does not matter whether the second bit of the flag cell(s) of a N=2 block are programmed, because the threshold voltage(s) of the flag cell(s) are positive in any case.

Normally, N is encoded in the flag cell(s) of a block the first time data are programmed to the block either the first time the block is used or following an erasure of the block. An exception to this general rule applies to flash memories that support partial page programming. If the flash memory supports partial page programming, then the flag cell(s) of a block optionally are programmed when N is selected, before any data are programmed to the block.

Figure 2:
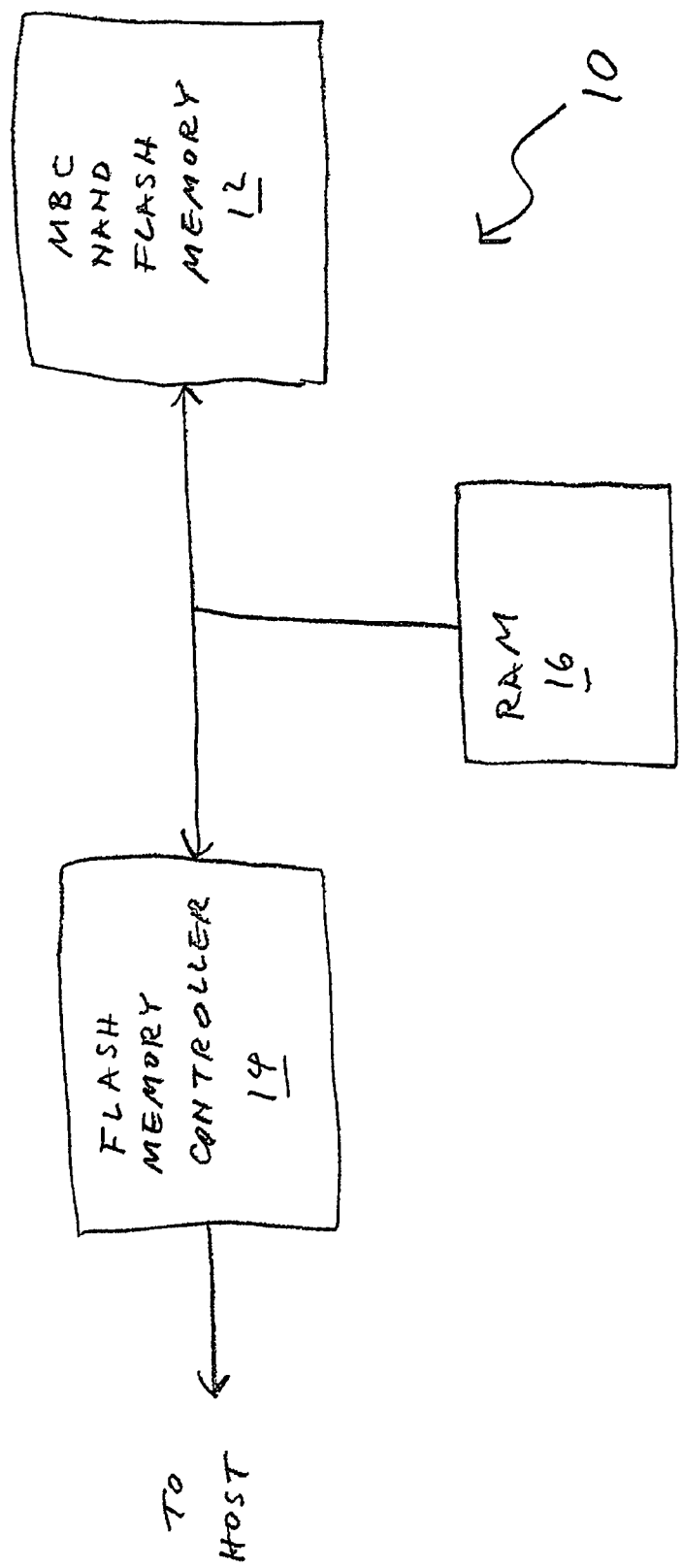
FIG. 2 is a high-level block diagram of a flash memory device of the present invention.

Returning now to the drawings, FIG. 2 is a high-level block diagram of a flash memory device 10 of the present invention. FIG. 2 is adapted from FIG. 1 of U.S. Pat. No. 5,404,485, to Ban, which patent is incorporated by reference for all purposes as if fully set forth herein. Device 10 includes an MBC NAND flash memory 12, a flash memory controller 14 and a RAM 16. Memory 12 includes a plurality of blocks 15, of which two are shown. Each block 15 includes four pages 17. Each page 17 includes a plurality of cells 18, of which two are shown in the first page 17. Controller 14 manages memory 12 as taught in U.S. Pat. No. 5,404,485 and in U.S. Pat. No. 5,937,425, also to Ban, which patent also is incorporated by reference for all purposes as if fully set forth herein. (U.S. Pat. No. 5,404,485 applies to the management of flash memories generally. U.S. Pat. No. 5,937,425 is specific to NAND flash memories.) Controller 14 exchanges data stored in memory 12 with a host device (not shown) in the conventional manner. For example, if device 10 is used for non-volatile data storage in a system such as a personal computer, then controller 14 communicates with the other components of the system via the system's bus. If device 10 is a portable storage device that is reversibly attached to a host using a suitable interface, for example the USB interface taught in U.S. Pat. No. 6,148,354, to Ban et al., then controller 14 communicates with the host via that interface.

In addition, controller 14 decides, for each block of memory 12, whether to store data in that block in SBC mode (N>1) or in MBC mode (N>1). Which mode is appropriate for which kind of data is up to the programmer of controller 14.

For example, as discussed above, Lee et al. advocate using SBC for caching of data that later are transferred to long term storage in MBC mode because of the greater programming speed of SBC mode vs. MBC mode. By contrast, Lasser et al., in US Patent Application Publication No. 2005/0024941, advocate using SBC mode rather than MBC mode for archiving data because of SBC mode's greater reliability. In each block of memory 12, controller 14 reserves one or more flag cells to store the value of N selected for that block and sets that/those flag cell(s) accordingly, as described above. During normal system power-up, or during recovery from a power failure, controller 14 reads each block's flag cell(s), as described above, to determine which value of N has been used to program the cells of that block.

Figure 3:
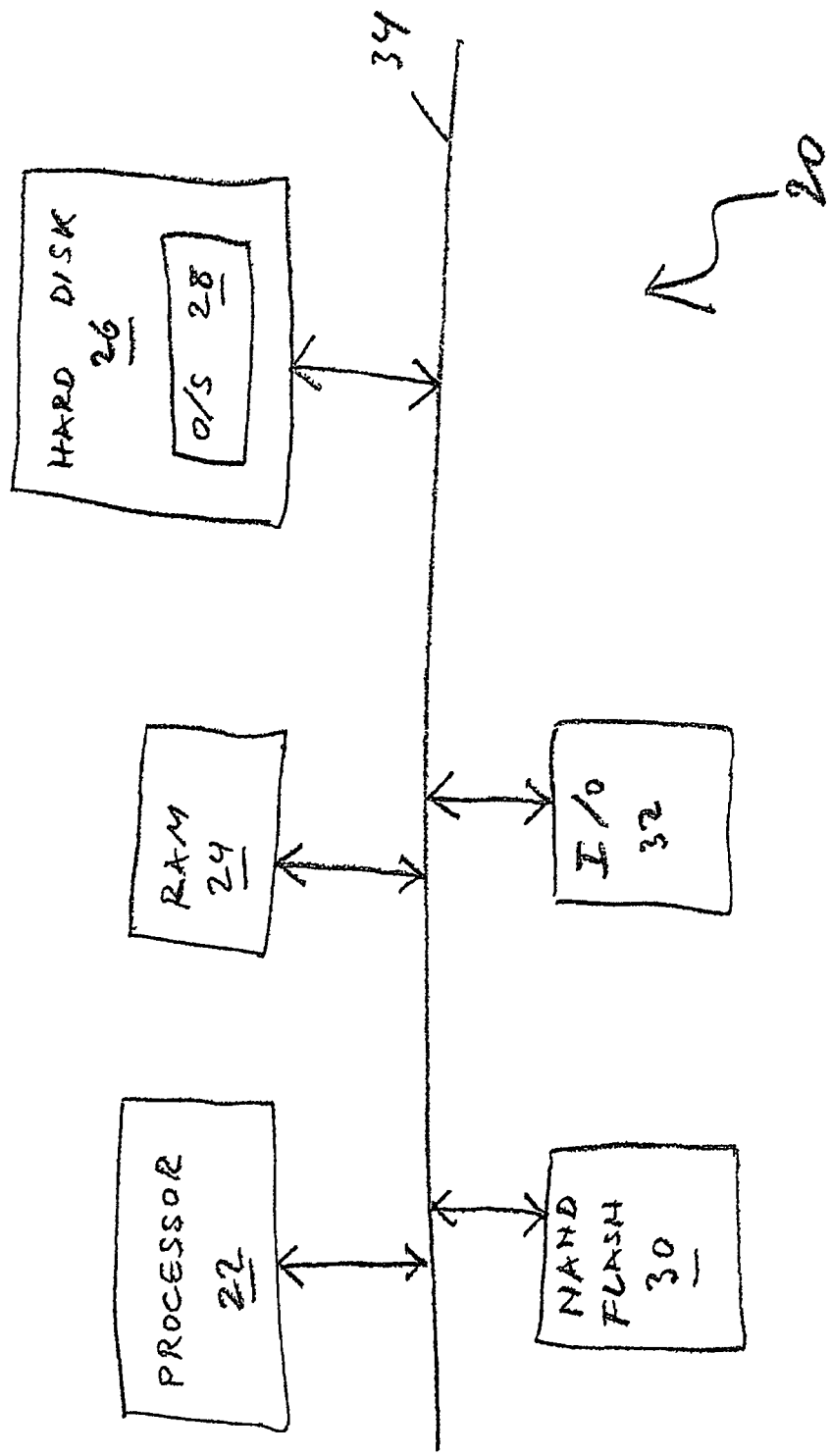
FIG. 3 is a high-level block diagram of a computer system of the present invention.

Device 10 is an example of a firmware implementation of the method of the present invention. FIG. 3 is a partial high level block diagram of a computer system 20 of the present invention that is an example of a software implementation of the method of the present invention. System 20 includes a processor 22; a RAM 24; input and output devices such as a keyboard and a display screen, represented collectively by I/O block 32; and two non-volatile mass storage memories: a hard disk 26 and an MBC NAND flash memory 30. Components 22, 24, 26, 30 and 32 communicate with each other via a common bus 34. Among the data stored on hard disk 26 is the code of an operating system 28. When system 20 is powered up, processor 22 downloads the code of operating system 28 to RAM 24 and then executes the code of operating system 28 from RAM 24 to manage the operation of system 20. Hard disk 26 thus is an example of a computer-readable storage medium in which is embedded computer-readable code for implementing the method of the present invention.

The code of operating system 28 includes code for managing NAND flash memory 30 as taught in U.S. Pat. No. 5,404,485 and in U.S. Pat. No. 5,937,425. The code of operating system 28 also includes code for managing NAND flash memory 30 according to the principles of the present invention. When an application being executed by processor 22 requires storage of user data in NAND flash memory 30, processor 22 executes the appropriate code of operating system 28 to decide, for the blocks of NAND flash memory 30 in which the user data are to be stored, whether to store the user data in that block in SBC mode (N=1) or in MBC mode (N>1). In each such block of NAND flash memory 30, processor 22 reserves one or more flag cells to store the value of N selected for that block and programs that/those flag cell(s) accordingly, as described above.

The above embodiment of the present invention has been described in terms of distinguishing between two different values of N. A similar second embodiment of the present invention can be used to distinguish among more than two possible values of N.

Let us assume (as an example) that N is selectable from a group containing exactly three values. This is for example the case when a block of cells can be programmed in one of three modes such as:

a. Each cell storing one bit.
b. Each cell storing two bits.
c. Each cell storing three bits.

One way of implementing the methods of the first embodiment of the present invention for distinguishing between the possible modes is to assign two cells ("C1" and "C2") per block as flag cells, use only one bit of each flag cell, and define a correspondence between the values of those bits and the possible modes. For example:

i. One bit per cell indicated by cell C1=left unprogrammed, cell C2=left unprogrammed.
ii. Two bits per cell indicated by cell C1=left unprogrammed, cell C2=programmed.
iii. Three bits per cell indicated by cell C1=programmed, cell C2 programmed.

When attempting to find out the mode with which the block was programmed, we read the flag cells according to the methods of the first embodiment (for example by reading according to the 1-bit programming mode), and then translate the reading from the flag cells into the corresponding mode.

Although this works, it requires the allocation of at least two cells from each block to act as flag cells. Typically a designer is reluctant to rely on a single reading and elects to have redundancy to overcome cells' failures. So a designer may decide to use three copies of the flag cells and use majority voting to decide among them. In such case the above example requires the allocation of six flag cells per block. The flag cells are not useful for storing user data and therefore are an overhead that reduces the useful amount of space in the device. Therefore there is great benefit in having methods that achieve the same result of distinguishing between the programming modes of a block but that use a lower number of flag cells.

The following second embodiment of the present invention achieves this benefit by taking advantage of the following argument—if the data cells of the block are capable of being programmed with $X \leq 2^N$ different values of N bits per cell, then they are necessarily capable of being programmed into at least X different states when used in the mode of highest N. For the case of the above example, if the data cells can be programmed with the three possible modes of one, two or three bits per cell, then they are programmable into three different states when used with the N=3 mode. (Note that it is not necessarily true that the highest possible number of bits per cell is equal to the number of different modes. For example, the cells may be operated with N selectable only from one, two or four bits per cell. The highest number of bits per cell is four, but the number X of different modes is three and not four).

In the context of the second embodiment of the present invention, the term "flag" should be understood to refer, not only to a binary flag which can designate one out of two states, but also to designation of one state out of X, with X being any integer.

Because the flag cells are physically the same as the data cells, the flag cells have the same capability as the data cells to represent at least X different states. So a single flag cell is able to represent all possible values of N, and a single flag cell suffices to code the required mode information. Of course, a designer may still decide to duplicate the flag cells for not relying on a single cell, but even using three copies will result now in only three flag cells, a much more efficient result than before.

Figure 4:
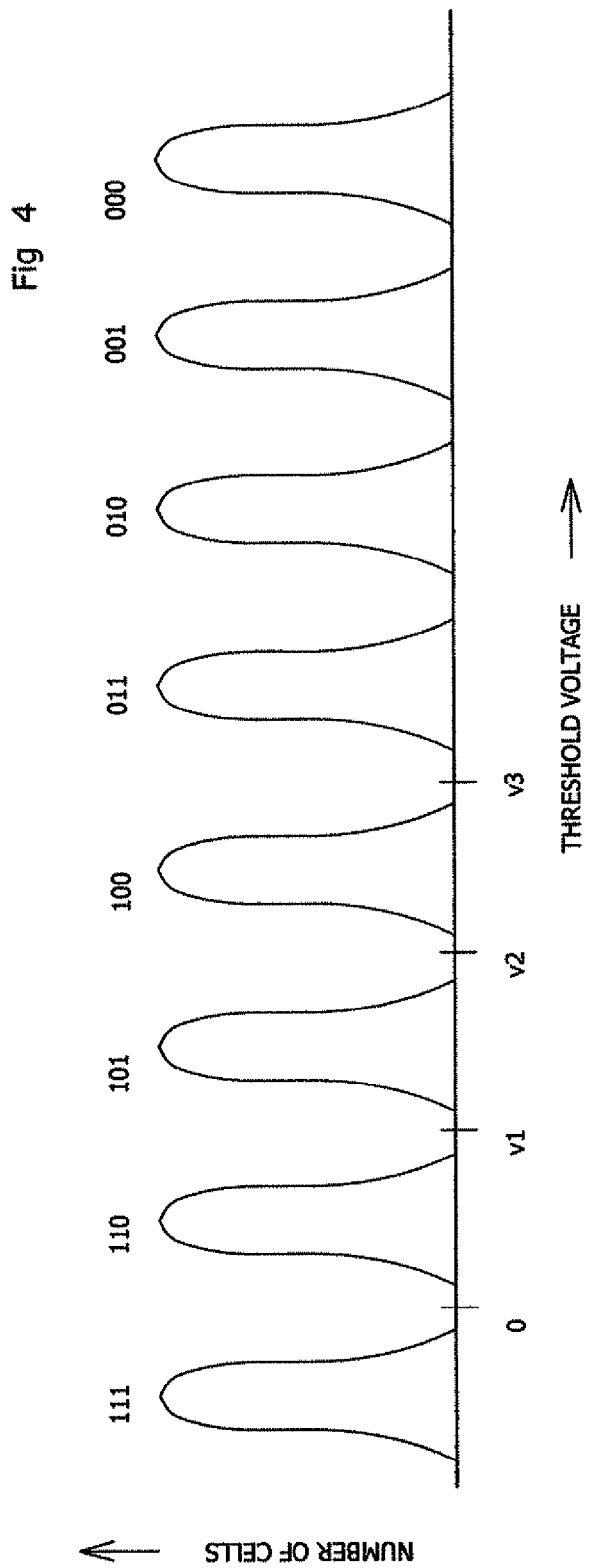
FIG. 4 illustrates the threshold voltage distributions of flash cells programmed in 3-bit mode.

Let us see how this can be achieved for the case of the previous example. We use the terminology and notation of U.S. patent application Ser. No. 11/035,807 filed on Jan. 18, 2005 by the present inventor. (U.S. Ser. No. 11/035,807 is incorporated by reference for all purposes as if fully set forth herein.) FIG. 4 shows the threshold voltage distribution and a possible bits encoding scheme for the case of three bits per cell. Specifically, FIG. 4 shows the eight peaks of the distribution corresponding to the eight states required for representing three bits, and also shows (above each peak) the values of the three stored bits corresponding to that state according to the encoding scheme. The un-programmed state ("111") corresponds to the left-most peak.

The flag cell is programmed according to N=3, no matter what value of N is used for the other cells of the block. If the block of cells is to be programmed at one bit per cell, the first bit (the least significant bit according to our notation) of the flag cell is set to "0", bringing the flag cell to the state of "110". If the block of cells is to be programmed at two bits per cell, the second bit of the flag cell is set to "0", bringing the flag cell to the state of "100". If the block of cells is to be programmed at three bits per cell, the third bit of the flag cell is set to "0", bringing the flag cell to the state of "000".

Figure 5:
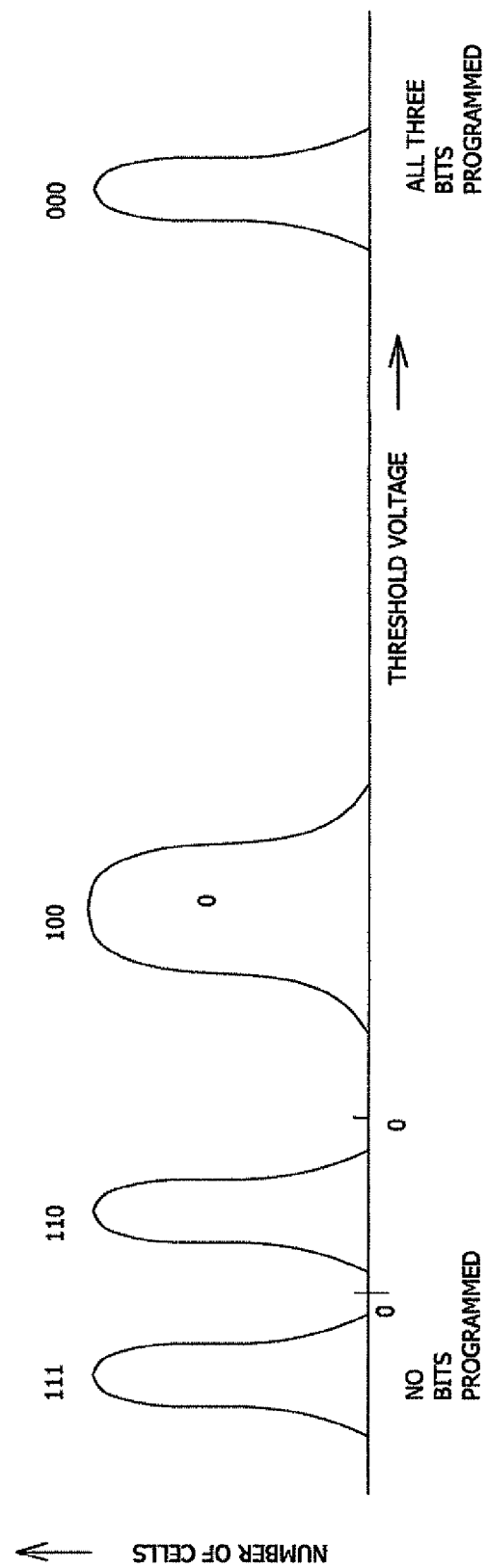
FIG. 5 illustrates a possible threshold distribution of flash cells that are incompletely programmed in 3-bit mode.

Reading the flag cell in the N=3 mode returns one of the following values—"111", "110", "100" or "000". The returned value unambiguously identifies the number of bits stored in the corresponding data cells, as follows i. "111"—no data stored
  ii. "110"—one bit stored
  iii. "100"—two bits stored
  iv "000"—three bits stored There are some flash cell implementations in which reading in the N=3 mode might not produce reliable results if the cell was programmed with fewer than three bits per cell. One such case is the case of FIG. 1C of the Field and Background section: reading a cell programmed with N=1 using the N=2 mode might result in errors, as the N=1 distribution peak might be different in position and width from the N=2 distribution peaks. FIG. 5 shows such a case for a three-bits-per-cell-device, where only the states applicable to programming flag cells according to the above procedure are shown. As shown in FIG. 5, after setting two of the bits of the flag cell to "0", the resulting distribution peak is not as shown for "100" in FIG. 4, but is wider and shifted to the left. Attempting to read the flag cell using regular N=3 methods might return "101", which is not a valid value for a flag cell. This is so because the "100" distribution at this stage is wide and overlaps the range occupied by "101" in a regular N=3 distribution.

However, even in such cases the methods of the second embodiment of the present invention still are useful. The reading of the flag cell may be done in sequential stages. For example:

i. A first reading is done comparing the flag cell's threshold voltage to a reference of zero volts that reliably separates the non-programmed state from all programmed states.
  ii. If the first reading shows the flag cell to have a threshold lower than zero volts, we know the block was not programmed at all, and the process ends here.
  iii. If the first reading shows the flag cell to have a threshold higher than zero volts, a second reading is done comparing the flag cell's threshold voltage to a reference $V_1$ that reliably separates between the state of exactly one bit set to zero and between the states of two or three bits set to zero. All that is required is that $V_1$ reliably separates between the state of only one bit set to zero and the other two programmed states and thus provides a reliable reading of the flag's second bit, and there is no need to get a full three-bit reading.
  iv. If the second reading shows the flag cell to have a threshold lower than $V_1$, we know the block was programmed with N=1, and the process ends here.
  v. If the second reading shows the flag cell to have a threshold higher than $V_1$, a third reading is done comparing the flag cell's threshold voltage to a reference $V_3$ that reliably separates between the state of exactly three bits set to zero and between the states of two or fewer bits set to zero. All that is required is that $V_3$ reliably separates between the state of all bits set to zero and the other two programmed states and thus provides a reliable reading of the flag's third bit, and there is no need to get a full three-bit reading.
  vi. If the third reading shows the flag cell to have a threshold lower than $V_3$, we know the block was programmed with N=2, and the process ends here.
  vii. If the third reading shows the flag cell to have a threshold higher than $V_3$ then we know the block was programmed with N=3, and the process ends here.

The method of the present invention are applicable not only for finding out the number of bits per cell selected for programming a block, but also the current number of bits stored in a portion of a block, even if this number is just an intermediate stage on the way to a different number of bits per cell. If the smallest chunk of programming is smaller than the smallest chunk of erasing (as is typically the case in NAND flash devices, where the smallest chunk for programming is a page and the smallest chunk for erasing is a block, with a block containing several pages), then in this case the flag cells are associated with a page rather than with a block. If a page is to store three bits per cell (for example because its containing block is selected to operate in three-bits-per-cell mode), but the programming process is done in stages, so that first one bit is stored in each cell of the page, then a second bit is added to each cell, and finally a third bit is added to each cell, the methods of the current invention can be used for keeping track where we are in the sequence of writing the three bits. This is useful, for example, when the programming sequence might be interrupted before completing programming of all the bits (as may be the case when the data of the first bits are programmed when the data for the last bits are not yet available), as the methods can tell us how many bits had already been stored so far into the cells, enabling us to correctly continue the interrupted sequence and complete storing all bits. Reading the flag cell of a page to determine how many bits (of the N possible bits) of the data cells have been programmed is done as described above, with "page" substituted for "block", i.e.:

i. A first reading is done comparing the flag cell's threshold voltage to a reference of zero volts that reliably separates the non-programmed state from all programmed states.
  ii. If the first reading shows the flag cell to have a threshold lower than zero volts, we know the page was not programmed at all, and the process ends here.
  iii. If the first reading shows the flag cell to have a threshold higher than zero volts, a second reading is done comparing the flag cell's threshold voltage to a reference $V_1$ that reliably separates between the state of exactly one bit set to zero and between the states of two or three bits set to zero. All that is required is that $V_1$ reliably separates between the state of only one bit set to zero and the other two programmed states and thus provides a reliable reading of the flag's second bit, and there is no need to get a full three-bit reading.
  iv. If the second reading shows the flag cell to have a threshold lower than $V_1$, we know the page was programmed with exactly one bit per cell, and the process ends here.
  v. If the second reading shows the flag cell to have a threshold higher than $V_1$, a third reading is done comparing the flag cell's threshold voltage to a reference $V_3$ that reliably separates between the state of exactly three bits set to zero and between the states of two or fewer bits set to zero. All that is required is that $V_3$ reliably separates between the state of all bits set to zero and the other two programmed states and thus provides a reliable reading of the flag's third bit, and there is no need to get a fall three-bit reading.

vi. If the third reading shows the flag cell to have a threshold lower than $V_3$, we know the page was programmed with exactly two bits, and the process ends here.

vii. If the third reading shows the flag cell to have a threshold higher than $V_3$ then we know the page was programmed with exactly three bits, and the process ends here.

It should be noted that the methods of the present invention are useful in both of the following scenarios:

a. While attempting to read data, finding out the right mode to use for reading so as to match the mode used for writing the data. This is useful, for example, when powering up the storage system and having to read data without having prior knowledge about the mode in which that data had been written before.

b. While attempting to write data, finding out the current number of bits already stored in the page to be written for the purpose of correctly carrying out the next step of programming the next bit to the written cells. Of course in such case it is possible to store the number of bits already written in the controller performing the writing, but learning this information from the flag cells without having to store this information in the controller is much preferable for simplifying the control logic and for allowing interruptions in the programming sequence between the steps of writing successive bits.

Even though the discussion above uses examples in which N is selectable from three possible values, the present invention is not limited to such examples. All of the above is equally applicable to cases in which N is selectable from four possible values (e.g. 1, 2, 3 and 4 bits per cell), or to cases in which N is selectable from more than four possible values. It is trivial to extend the above methods to those cases.

FIGS. 2 and 3, that were used above to illustrate a memory device and a computer system for implementing the first embodiment of the present invention, also serve to illustrate a memory device and a computer system for implementing the second embodiment of the present invention.

In the context of the second embodiment of the present invention, controller 14 of FIG. 2 decides, for each block of memory 12, which of at least three possible values of N to use for programming the data cells of that block. In each block of memory 12, controller 14 reserves one or more flag cells to program so as to represent the value of N selected for that block, and then sets that/those flag cells(s) accordingly, as described above. Optionally, in a block for which controller 14 has set N>1, controller 14 reserves one or more flag cells in each page of the block to program so as to represent the number of bits stored so far in the data cells of that page. As each page is programmed successively with more and more bits per data cell, controller 14 sets the flag cell(s) of the page to indicate how many bits have been programmed so far in the data cells of the page, as described above.

Also in the context of the second embodiment of the present invention, the code of operating system 28 of FIG. 3 includes code for managing NAND flash memory 30 as taught in U.S. Pat. No. 5,404,485 and in U.S. Pat. No. 5,937,425, and also code for managing NAND flash memory 30 according to the second embodiment of the present invention. When an application being executed by processor 22 requires storage of user data in NAND flash memory 30, processor 22 executes the appropriate code of operating system 28 to decide, for the blocks of NAND flash memory 30, in which the user data are to be stored, which of at least three possible values of N to use for programming the data cells of that block. In each such block of NAND flash memory 30, processor 22 reserves one or more flag cells to program so as to represent the value of N selected for that block, and then sets that/those flag cell(s) accordingly, as described above. Optionally, in a block for which processor 22 has set N>1, processor 22 reserves one or more flag cells in each page of the block to program so as to represent the number of bits stored so far in the data cells of that page. As each page is programmed successively with more and more bits per data cell, processor 22 sets the flag cell(s) of the page to indicate how many bits have been programmed so far in the data cells of the page, as described above.

While the invention has been described with respect to a limited number of embodiments, it will be appreciated that many variations, modifications and other applications of the invention may be made.

What is claimed is:

1. A method of managing a plurality of non-volatile memory cells, each memory cell having a corresponding storage window divisible into a plurality of ranges of storage levels representative of N>3 bits, the method comprising:
reserving a single cell of the memory cells to use as a flag storage element to represent a value of N for each of a plurality of other memory cells;
selecting the value of N; and
successively, for each value of n between 1 and N:
setting each memory cell of said plurality of other memory cells to represent bits 1 through n of said N bits, and
setting each reserved single cell to represent n;
wherein said memory cells of said plurality of other memory cells are not erased between said successive settings of said memory cells of said plurality of other memory cells and wherein the single cell is maintained in a programmed state between said successive settings of the single cell until after said memory cells of said plurality of other memory cells have been set to represent bits 1 through N and the single cell has been set to represent N.

2. The method of claim 1, wherein only one of said memory cells is reserved to represent the value of N for each of the plurality of other memory cells.

3. The method of claim 1, further comprising reserving a second single cell of at least one of the memory cells to use as a second flag storage element.

4. The method of claim 1, wherein said value of N is three.

5. The method of claim 1, wherein said value of N is four.

6. A memory device comprising:
a plurality of non-volatile memory cells, each memory cell having a corresponding storage window divisible into a plurality of ranges of storage levels representative of N>3 bits of data; and
a controller to:
reserve a single cell of at least one of said memory cells to use as a flag storage element to represent a value of N for each of a plurality of other said memory cells;
select a value of N; and
successively, for each value of n between 1 and N:
set each memory cell of said plurality of other memory cells to represent bits 1 through n of said N bits, and
set each reserved single cell to represent n;
wherein said memory cells of said plurality of other memory cells are not erased between said successive settings of said memory cells of said plurality of other memory cells and wherein the single cell is maintained in a programmed state between said successive settings of the single cell until after said memory cells of said plurality of other memory cells have been set to represent bits 1 through N and the single cell has been set to represent N.

7. The memory device of claim 6, wherein said controller is operative to reserve only one of said memory cells to represent the value of N for each of the plurality of other memory cells.

8. The memory device of claim 6, wherein said controller is operative to reserve a second single cell of the memory cells to use as a second flag storage element.

9. The memory device of claim 6, wherein said controller is operative to select said value of N equal to three.

10. The memory device of claim 6, wherein said controller is operative to select said value of N equal to four.

11. A system comprising:
a plurality of non-volatile memory cells, each memory cell having a corresponding storage window divisible into a plurality of ranges of storage levels representative of N>3 bits of data; and
a non-volatile memory storing program code to:
reserve a single cell of at least one of said memory cells to use as a flag storage element to represent a value of N for each of a plurality of other said memory cells;
select a value of N; and
successively, for each value of n between 1 and N:
set each memory cell of said plurality of other memory cells to represent bits 1 through n of said N bits, and
set each reserved single cell to represent n;
wherein said memory cells of said plurality of other memory cells are not erased between said successive settings of said memory cells of said plurality of other memory cells and wherein the single cell is maintained in a programmed state between said successive settings of the single cell until after said memory cells of said plurality of other memory cells have been set to represent bits 1 through N and the single cell has been set to represent N; and
a processor to execute said program code.

12. The system of claim 11, wherein said program code is to reserve only one of said memory cells to represent the value of N for each of the plurality of other memory cells.

13. The system of claim 11, wherein said program code is to reserve a second single cell of the memory cells to use as a second flag storage element.

14. The system of claim 11, wherein said program code is to select said value of N equal to three.

15. The system of claim 11, wherein said program code is to select said value of N equal to four.

16. A computer-readable storage medium storing computer-readable code to manage a plurality of non-volatile memory cells, wherein each memory cell has a corresponding storage window divisible into a plurality of ranges of storage levels representative of N>3 bits of data, the computer-readable code comprising processor executable instructions that, when executed by a processor, cause the processor to:
reserve a single cell of at least one of the memory cells to use as a flag storage element to represent a value of N for each of a plurality of other memory cells;
select the value of N; and
successively, for each value of n between 1 and N:
set each memory cell of said plurality of other memory cells to represent bits 1 through n of said N bits, and
set each reserved single cell to represent n;
wherein said memory cells of said plurality of other memory cells are not erased between said successive settings of said memory cells of said plurality of other memory cells and wherein the single cell is maintained in a programmed state between said successive settings of the single cell until after said memory cells of said plurality of other memory cells have been set to represent bits 1 through N and the single cell has been set to represent N.

17. The computer-readable storage medium of claim 16, wherein the processor executable instructions, when executed by the processor, cause the processor to reserve only one of said memory cells to represent the value of N for each of the plurality of other memory cells.

18. The computer-readable storage medium of claim 16, wherein the processor executable instructions, when executed by the processor, cause the processor to reserve a second single cell of the memory cells to use as a second flag storage element.

19. The computer-readable storage medium of claim 16, wherein the processor executable instructions, when executed by the processor, cause the processor to select said value of N equal to three.

20. The computer-readable storage medium of claim 16, wherein the processor executable instructions, when executed by the processor, cause the processor to select said value of N equal to four.

21. A method of managing a flash memory, the method comprising:
selecting a value of a number N>3 of respective bits of data to be stored in each of a plurality of memory cells of at least a portion of the flash memory;
reserving a single cell of at least one of the memory cells of the flash memory to use as a flag element to represent a value of how many of said N bits are stored in each memory cell of said plurality of memory cells; and
successively, for each value of n between 1 and N:
programming each memory cell of said plurality of memory cells to represent bits 1 through n of said N respective bits thereof, and
programming each reserved single cell to represent n;
wherein said memory cells of said plurality of memory cells are not erased between said successive programmings of said memory cells of said plurality of memory cells and wherein the single cell is maintained in a programmed state between said successive programmings of the single cell until after said memory cells of said plurality of memory cells have been programmed to represent bits 1 through N and the single cell has been programmed to represent N.

22. The method of claim 21, wherein said at least a portion of the flash memory is a block of the flash memory.

23. The method of claim 21, wherein said at least a portion of the flash memory is a page of the flash memory.

24. The method of claim 21, wherein N is selected equal to 3.

25. The method of claim 21, wherein N is selected equal to 4.

26. The method of claim 21, wherein said programming of each said memory cell of said plurality of memory cells and said programming of said single cell are effected simultaneously.

27. A memory device comprising:
a flash memory including at least one block, each block including at least one page, each page including a plurality of memory cells; and
a flash memory controller operative, for a portion of said flash memory selected from one of a block and a page:

to select a value of a number N>3 of respective bits of data to be stored in each of a plurality of memory cells of said portion;
to reserve a single cell of at least one of the memory cells of said portion to use as a flag element to represent a value of how many of said N bits are stored in each memory cell of said plurality of memory cells; and
successively, for each value of n between 1 and N:
to program each memory cell of said plurality of memory cells of said portion to represent bits 1 through n of said N respective bits thereof, and
to program each reserved single cell to represent n;
wherein said memory cells of said plurality of memory cells of said portion are not erased between said successive programmings of said memory cells of said plurality of memory cells of said portion and wherein the single cell is maintained in a programmed state between said successive programmings of the single cell until after said memory cells of said plurality of memory cells of said portion have been programmed to represent bits 1 through N and the single cell has been programmed to represent N.

28. The memory device of claim 27, wherein N=3.

29. The memory device of claim 27, wherein N=4.

30. A system comprising:
a flash memory including at least one block, each block including at least one page, each page including a plurality of memory cells;
a non-volatile memory storing program code operative, for a portion of said flash memory selected from one of a block and a page:
to select a value of a number N>3 of respective bits of data to be stored in each of a plurality of memory cells of said portion;
to reserve a single cell of at least one of the memory cells of said portion to use as a flag element to represent a value of how many of said N bits are stored in each memory cell of said plurality of memory cells; and
successively, for each value of n between 1 and N:
to program each memory cell of said plurality of memory cells of said portion to represent bits 1 through n of said N respective bits thereof, and
to program each reserved single cell to represent n;
wherein said memory cells of said plurality of memory cells of said portion are not erased between said successive programmings of said memory cells of said plurality of memory cells of said portion and wherein the single cell is maintained in a programmed state between said successive programmings of the single cell until after said memory cells of said plurality of memory cells of said portion have been programmed to represent bits 1 through N and the single cell has been programmed to represent N; and
a processor to execute said program code.

31. The system of claim 30, wherein N=3.

32. The system of claim 30, wherein N=4.

33. A computer-readable storage medium storing computer-readable code to manage a flash memory that includes a first block, the first block including at least one page, the at least one page including a plurality of memory cells, the computer-readable code comprising program code that, when executed by a processor, causes the processor to:
select a value of a number N>3 of respective bits of data to be stored in each of the plurality of memory cells;
reserve a single cell of at least one of the memory cells to use as a flag element to represent a value of how many of said N bits are stored in each memory cell of said plurality of memory cells; and
successively, for each value of n between 1 and N:
program each memory cell of said plurality of memory cells to represent bits 1 through n of said N respective bits thereof, and
program each reserved single cell to represent n;
wherein said memory cells of said plurality of memory cells are not erased between said successive programmings of said memory cells of said plurality of memory cells and wherein the single cell is maintained in a programmed state between said successive programmings of the single cell until after said memory cells of said plurality of memory cells have been programmed to represent bits 1 through N and the single cell has been programmed to represent N.

34. The computer-readable storage medium of claim 33, wherein N=3.

35. The computer-readable storage medium of claim 33, wherein N=4.

36. A method of managing non-volatile memory cells individually having a storage window divisible into a plurality of ranges of storage levels representative of at least one bit of data and which are separated from one another, the method comprising:
selecting a number N≧3 of respective bits to be represented by the ranges of the storage levels of each of a plurality of the memory cells;
reserving a single cell of at least one of the memory cells to use as a flag storage element to represent a value of how many of said N respective bits are stored in each memory cell of said plurality of memory cells; and
successively, for each value of n between 1 and N:
setting each memory cell of said plurality of memory cells to represent bits 1 through n of said N respective bits thereof, and
setting each reserved single cell to represent n;
wherein said memory cells of said plurality of memory cells are not erased between said successive settings of said memory cells and wherein said single cell is maintained in a programmed state between said successive settings of said single cell until after said memory cells of said plurality of memory cells have been set to represent bits 1 through N and said single cell has been set to represent N.

37. The method of claim 36, wherein N is selected equal to 3.

38. The method of claim 36, wherein N is selected equal to 4.

39. The method of claim 36, wherein said setting of each said memory cell and said setting of said single cell are effected simultaneously.

40. A memory device comprising:
non-volatile memory cells, each memory cell having a corresponding storage window divisible into a plurality of ranges of storage levels representative of at least one bit of data; and
a controller to:
select a number N≧3 of respective bits to be represented by the ranges of the storage levels of each of a plurality of said memory cells;
reserve a single cell of at least one of the memory cells to use as a flag storage element to represent a value of how many of said N respective bits are stored in each memory cell of said plurality of memory cells; and successively, for each value of n between 1 and N:
   set each memory cell of said plurality of memory cells to represent bits 1 through n of said N respective bits thereof, and
   set each reserved single cell to represent n;
wherein said memory cells of said plurality of memory cells are not erased between said successive settings of said memory cells and
   wherein said single cell is maintained in a programmed state between said successive settings of said single cell until after said memory cells of said plurality of memory cells have been set to represent bits 1 through N and said single cell has been set to represent N.

41. The memory device of claim 40, wherein N=3.

42. The memory device of claim 40, wherein N=4.

43. A system comprising:
non-volatile memory cells, each memory cell having a corresponding storage window divisible into a plurality of ranges of storage levels representative of at least one bit of data;
a non-volatile memory storing program code to:
   select a number N≧3 of respective bits to be represented by the ranges of the storage levels of each of a plurality of said memory cells;
   reserve a single cell of at least one of the memory cells to use as a flag storage element to represent a value of how many of said N respective bits are stored in each memory cell of said plurality of memory cells; and
   successively, for each value of n between 1 and N:
      set each memory cell of said plurality of memory cells to represent bits 1 through n of said N respective bits thereof, and
      set each reserved single cell to represent n;
   wherein said memory cells of said plurality of memory cells are not erased between said successive settings of said memory cells of said plurality of memory cells and wherein said single cell is maintained in a programmed state between said successive settings of said single cell until after said memory cells of said plurality of memory cells have been set to represent bits 1 through N and said single cell has been set to represent N; and
a processor to execute said program code.

44. The system of claim 43, wherein N=3.

45. The system of claim 43, wherein N=4.

46. A computer-readable storage medium storing computer-readable code to manage non-volatile memory cells, wherein each memory cell has a corresponding storage window divisible into a plurality of ranges of storage levels representative of at least one bit of data, the computer-readable code comprising processor executable instructions that, when executed by a processor, cause the processor to:
   select a number N≧3 of respective bits to be represented by the ranges of the storage levels of each of a plurality of said memory cells;
   reserve a single cell of at least one of the memory cells to use as a flag storage element to represent a value of how many of said N respective bits are stored in each memory cell of said plurality of memory cells; and
   successively, for each value of n between 1 and N:
      set each memory cell of said plurality of memory cells to represent bits 1 through n of said N respective bits thereof, and
      set each reserved single cell to represent n;
   wherein said memory cells of said plurality of memory cells are not erased between said successive settings of said memory cells of said plurality of memory cells and wherein said single cell is maintained in a programmed state between said successive settings of said single cell until after said memory cells of said plurality of memory cells have been set to represent bits 1 through N and said single cell has been set to represent N.

47. The computer-readable storage medium of claim 46, wherein N=3.

48. The computer-readable storage medium of claim 46, wherein N=4.

49. The method of claim 1, wherein setting the single cell for each value of n includes increasing a threshold voltage of the single cell from a prior value of the threshold voltage associated with a prior value of n.

50. The memory device of claim 6, wherein setting the single cell for each value of n includes increasing a threshold voltage of the single cell from a prior value of the threshold voltage associated with a prior value of n.

51. The system of claim 11, wherein setting the single cell for each value of n includes increasing a threshold voltage of the single cell from a prior value of the threshold voltage associated with a prior value of n.

52. The computer-readable storage medium of claim 16, wherein setting the single cell for each value of n includes increasing a threshold voltage of the single cell from a prior value of the threshold voltage associated with a prior value of n.

53. The method of claim 21, wherein programming the single cell for each value of n includes increasing a threshold voltage of the single cell from a prior value of the threshold voltage associated with a prior value of n.

54. The memory device of claim 27, wherein programming the single cell for each value of n includes increasing a threshold voltage of the single cell from a prior value of the threshold voltage associated with a prior value of n.

55. The system of claim 30, wherein programming the single cell for each value of n includes increasing a threshold voltage of the single cell from a prior value of the threshold voltage associated with a prior value of n.

56. The computer-readable storage medium of claim 33, wherein programming the single cell for each value of n includes increasing a threshold voltage of the single cell from a prior value of the threshold voltage associated with a prior value of n.

57. The method of claim 36, wherein setting the single cell for each value of n includes increasing a threshold voltage of the single cell from a prior value of the threshold voltage associated with a prior value of n.

58. The memory device of claim 40, wherein setting the single cell for each value of n includes increasing a threshold voltage of the single cell from a prior value of the threshold voltage associated with a prior value of n.

59. The system of claim 43, wherein setting the single cell for each value of n includes increasing a threshold voltage of the single cell from a prior value of the threshold voltage associated with a prior value of n.

60. The computer-readable storage medium of claim 46, wherein setting the single cell for each value of n includes increasing a threshold voltage of the single cell from a prior value of the threshold voltage associated with a prior value of n.

* * * * *

UNITED STATES PATENT AND TRADEMARK OFFICE
CERTIFICATE OF CORRECTION

| | | |
|---|---|---|
| PATENT NO. | : 8,024,509 B2 | Page 1 of 1 |
| APPLICATION NO. | : 11/923688 | |
| DATED | : September 20, 2011 | |
| INVENTOR(S) | : Menahem Lasser et al. | |

It is certified that error appears in the above-identified patent and that said Letters Patent is hereby corrected as shown below:

In the Claims,

Column 16, Claim 1, Line 20, "levels representative of N>3 bits, the method comprising" should read --levels representative of N≥3 bits, the method comprising--.

Column 16, Claim 6, Line 51, "N>3 bit of data; and" should read --N≥3 bits of data; and--.

Column 17, Claim 11, Line 19, "N>3 bits of data; and" should read --N≥3 bits of data; and--.

Column 17, Claim 16, Line 54, "levels representative of N>3 bits of data, the computer-readable" should read --levels representative of N≥3 bits of data, the computer-readable--.

Column 18, Claim 21, Line 28, "selecting a value of a number N>3 of respective bits of data" should read --selecting a value of a number N≥3 of respective bits of data--.

Column 19, Claim 27, Line 1, "to select a value of a number N>3 of respective bits of" should read --to select a value of a number of N≥3 of respective bits of--.

Column 19, Claim 30, Line 33, "to select a value of a number N>3 of respective bits of data" should read --to select a value of a number N≥3 of respective bits of data--.

Column 19, Claim 33, Line 66, "select a value of a number N>3 of respective bits of data to" should read --select a value of a number N≥ 3 of respective bits of data to--.

Signed and Sealed this
Sixteenth Day of June, 2015

Michelle K. Lee
*Director of the United States Patent and Trademark Office*